United States Patent
Chen et al.

(10) Patent No.: US 12,038,693 B2
(45) Date of Patent: *Jul. 16, 2024

(54) METHOD OF MANUFACTURING PHOTO MASKS

(71) Applicant: TAIWAN SEMICONDUCTOR MANUFACTURING COMPANY, LTD., Hsinchu (TW)

(72) Inventors: Chien-Cheng Chen, Hsinchu County (TW); Chia-Jen Chen, Jhudong Township (TW); Hsin-Chang Lee, Zhubei (TW); Shih-Ming Chang, Hsinchu (TW); Tran-Hui Shen, Dounan Township (TW); Yen-Cheng Ho, Taichung (TW); Chen-Shao Hsu, Changhua County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/197,563

(22) Filed: May 15, 2023

(65) Prior Publication Data
US 2023/0288813 A1   Sep. 14, 2023

Related U.S. Application Data

(60) Continuation of application No. 17/740,048, filed on May 9, 2022, now Pat. No. 11,687,006, which is a continuation of application No. 17/080,652, filed on Oct. 26, 2020, now Pat. No. 11,327,405, which is a division of application No. 15/966,862, filed on Apr. 30, 2018, now Pat. No. 10,816,892.

(60) Provisional application No. 62/586,085, filed on Nov. 14, 2017.

(51) Int. Cl.
| *G03F 7/00* | (2006.01) |
| *G03F 1/36* | (2012.01) |
| *G03F 1/78* | (2012.01) |
| *G03F 1/76* | (2012.01) |
| *G03F 7/20* | (2006.01) |
| *H01J 37/317* | (2006.01) |

(52) U.S. Cl.
CPC ............ *G03F 7/70441* (2013.01); *G03F 1/36* (2013.01); *G03F 1/78* (2013.01); *G03F 1/76* (2013.01); *G03F 7/2002* (2013.01); *G03F 7/70358* (2013.01); *G03F 7/70608* (2013.01); *G03F 7/70616* (2013.01); *G03F 7/70716* (2013.01); *H01J 37/3174* (2013.01); *H01J 2237/31771* (2013.01)

(58) Field of Classification Search
CPC ........... G03F 1/36; G03F 1/78; G03F 7/70441
USPC ............................................... 430/5, 30, 296
See application file for complete search history.

(56) References Cited

U.S. PATENT DOCUMENTS

| 4,463,265 | A | 7/1984 | Owen et al. |
| 6,872,507 | B2 | 3/2005 | Tzu et al. |
| 8,178,280 | B2 | 5/2012 | Chang et al. |
| 8,796,666 | B1 | 8/2014 | Huang et al. |
| 8,945,803 | B2 | 2/2015 | Chen et al. |
| 9,093,530 | B2 | 7/2015 | Huang et al. |
| 9,269,537 | B2 | 2/2016 | Tseng et al. |
| 9,305,799 | B2 | 4/2016 | Chen et al. |
| 9,336,993 | B2 | 5/2016 | Yu |
| 9,367,661 | B2 | 6/2016 | Jou et al. |
| 9,529,959 | B2 | 12/2016 | Wang et al. |
| 9,548,303 | B2 | 1/2017 | Lee et al. |
| 9,810,994 | B2 | 11/2017 | Lin et al. |
| 11,687,006 | B2 * | 6/2023 | Chen ................... G03F 7/70441 430/296 |

OTHER PUBLICATIONS

Notice of Allowance issued in U.S. Appl. No. 15/966,862 dated Jun. 22, 2020.
Notice of Allowance issued in related U.S. Appl. No. 17/080,652 dated Jan. 10, 2022.
Notice of Allowance issued in related U.S. Appl. No. 17/740,048 dated Feb. 15, 2023.

* cited by examiner

*Primary Examiner* — Christopher G Young
(74) *Attorney, Agent, or Firm* — STUDEBAKER & BRACKETT PC

(57) ABSTRACT

In a method of manufacturing a photo mask for lithography, circuit pattern data are acquired. A pattern density, which is a total pattern area per predetermined area, is calculated from the circuit pattern data. Dummy pattern data for areas having pattern density less than a threshold density are generated. Mask drawing data is generated from the circuit pattern data and the dummy pattern data. By using an electron beam from an electron beam lithography apparatus, patterns are drawn according to the mask drawing data on a resist layer formed on a mask blank substrate. The drawn resist layer is developed using a developing solution. Dummy patterns included in the dummy pattern data are not printed as a photo mask pattern when the resist layer is exposed with the electron beam and is developed.

20 Claims, 12 Drawing Sheets

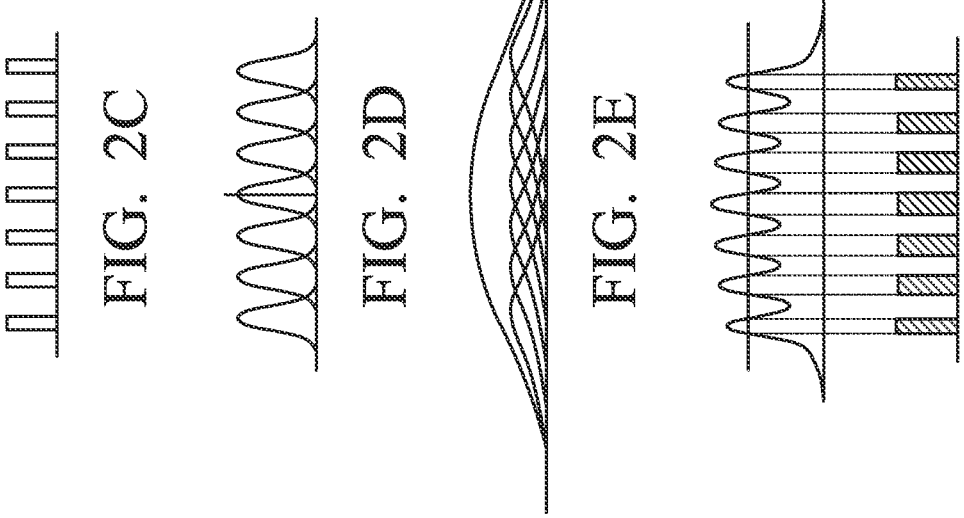
FIG. 2C
FIG. 2D
FIG. 2E
FIG. 2F
FIG. 2A
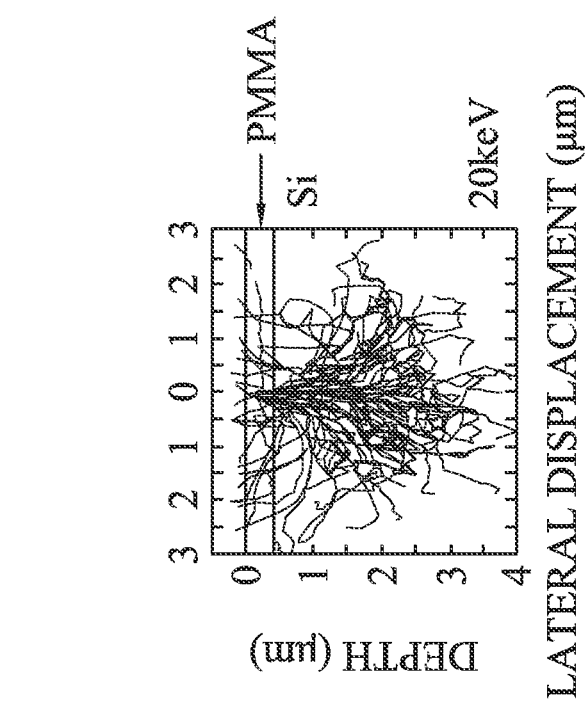
FIG. 2B

METHOD OF MANUFACTURING PHOTO MASKS

RELATED APPLICATION

This application is a continuation of U.S. patent application Ser. No. 17/740,048 filed May 9, 2022, which is a continuation of U.S. patent application Ser. No. 17/080,652 filed Oct. 26, 2020, now U.S. Pat. No. 11,327,405, which is a divisional application of U.S. patent application Ser. No. 15/966,862 filed Apr. 30, 2018, now U.S. Pat. No. 10,816,892, which claim priority to U.S. Provisional Application No. 62/586,085 filed on Nov. 14, 2017, the entire contents of each of which are incorporated herein by reference.

TECHNICAL FIELD

The disclosure relates to methods of manufacturing photo masks used in a semiconductor manufacturing process.

BACKGROUND

As semiconductor device feature sizes have decreased to sizes smaller than the wavelength of light used in photolithographic processes, the diffraction of light at feature pattern edges formed on the reticle causes a loss of resolution in transferring the reticle pattern to the wafer photoresist. Although patternable minimum resolution (e.g., pattern pitch) is limited by an optical lithography tool (e.g., optical scanner/stepper), design rule for a semiconductor device requires smaller or finer pattern resolution. At the same time, requirements for photo masks become tighter and tighter.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A shows an energy distribution of the scattered electron beams with a total energy distribution. FIG. 2B shows a simulation result of the traveling path of the backscattering electrons. FIG. 2C shows a mask pattern indicating line-and-space patterns. FIG. 2D shows energy distributions of the forward scattering. FIG. 2E shows energy distributions of the backward scattering, caused by electron beam irradiations. FIG. 2F shows an overall energy distribution and corresponding CD variation.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Embodiments of the present disclosure provide a method of manufacturing a photo mask used in a manufacturing operation of a semiconductor device and an apparatus for generating photo mask data for fabricating photo masks.

Many photo masks (also called reticles) are used for lithography operations in a semiconductor manufacturing process. The photo masks are generally formed using an electron beam lithography process. FIGS. 1A-1D show a general method of manufacturing a photo mask relating to embodiments of the present disclosure. It is understood that in the sequential manufacturing process, one or more additional operations can be provided before, during, and after the stages shown in FIGS. 1A-1D, and some of the operations described below can be replaced or eliminated for additional embodiments of the method. The order of the operations/processes may be interchangeable.

Figure 1A:
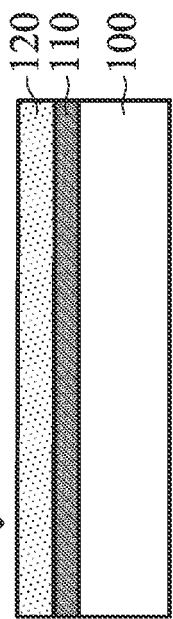
FIG. 1A shows various stages of a sequential mask making process relating to embodiments of the present disclosure.

As shown in FIG. 1A, a mask blank having a transparent mask substrate 100 and a pattern layer 110 formed thereon is provided, and a photo resist layer 120 is formed on the pattern layer 110. The transparent mask substrate 100 is made of, for example, a synthetic quartz having a high transparency for ultra violet light and deep ultra violet light (e.g., 245 nm light emitted from a KrF excimer laser or 193 nm light emitted from an ArF excimer laser). The photo resist layer 120 is sensitive to an energy beam, such as an electron beam, and either a positive photo resist or a negative photo resist. The pattern layer 110 is an opaque layer made of Cr or a Cr based material in some embodiments. In other embodiments, the pattern layer 110 is a semi-transparent layer made of a Mo based material for a phase shift mask. The pattern layer 110 is a single layer or a multilayer structure.

Figure 1B:
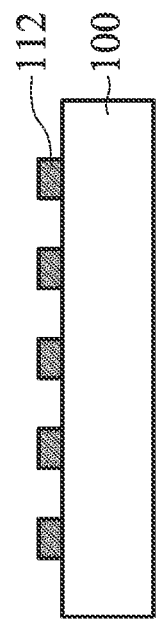
FIG. 1B shows various stages of a sequential mask making process relating to embodiments of the present disclosure.
Figure 1C:
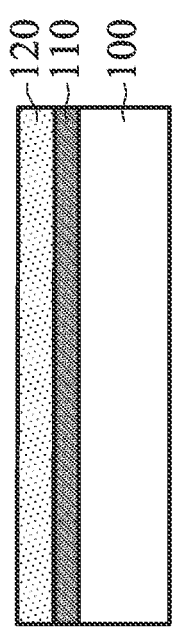
FIG. 1C shows various stages of a sequential mask making process relating to embodiments of the present disclosure.
Figure 1D:
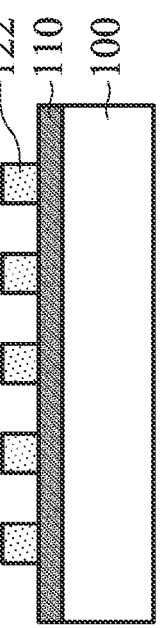
FIG. 1D shows various stages of a sequential mask making process relating to embodiments of the present disclosure.

According to mask pattern data, the mask blank with the photo resist layer 120 is exposed with an electron beam 150 in an electron beam lithography tool, as shown in FIG. 1B. The electron beam drawings are performed by scanning the electron beam and moving a mask stage on which the mask blank is placed. After the exposure by the electron beam, the exposed photo resist layer 120 is developed with a developing solution and a photo resist pattern 122 is formed as show in FIG. 1C. Then, by using the photo resist pattern 122 as an etching mask, the pattern layer 110 is etched by dry and/or wet etching and a mask pattern 112 is formed on the mask substrate 100, as shown in FIG. 1D.

In the electron beam lithography, the electron beam is irradiated to a place corresponding to a desired pattern. For example, when forming a hole pattern, the electron beam is irradiated to an area of a positive photo resist corresponding to the hole pattern, and when forming a line pattern, the electron beam is irradiated to an area of a negative photo resist corresponding to the line pattern. A positive photo resist or a negative photo resist is selected in view of the density of patterns to be irradiated such that the total areas of the irradiated regions are smaller than the total areas of the non-irradiated regions.

FIGS. 2A-2F show an impact of critical dimension (CD) uniformity caused by an electron beam proximity effect. An electron beam used in a photo mask fabrication process generally has a small beam area (a spot beam). When an electron beam is applied to an object (e.g., a photo resist), there is a forward scattering 201 and a backward scattering 202 as shown in FIG. 2A, which shows an energy distribution of the scattered electron beams with a total energy distribution 203. FIG. 2B shows a simulation result of the traveling path of the backscattering electrons. As shown in FIG. 2A, the scattered electrons have a broad tail portions, which may overlap an adjacent pattern irradiated.

FIG. 2C shows a mask pattern indicating line-and-space patterns. The peaks correspond to electron beam irradiated portions for lines. FIG. 2D shows energy distributions of the forward scattering, and FIG. 2E shows energy distributions of the backward scattering, caused by electron beam irradiations. FIG. 2F shows an overall energy distribution and corresponding CD variation. As shown in FIG. 2F, the line widths of the left and right end patterns are smaller than the remaining patterns, which is called electron beam proximity effect. As shown in FIG. 2F, the left and right end patterns receive less electron scattering effects than other patterns. If a single and isolated pattern is formed, there is substantially no electron scattering effect. In other words, the CD variation caused by the electron beam proximity effect is affected by the surrounding pattern situation, in particular, a pattern density.

Further, when a photo resist layer, which is generally formed by an organic material, is irradiated with electron beams, electrons are accumulated in the irradiated portions of the photo resist. The accumulated electrons cause an undesired electron field, affecting the orbit of an incoming electron beam, which is called an electrical charging effect. Similar to the electron beam proximity effect, the electrical charging effect depends on a pattern density.

According to one aspect of the present disclosure, one or more dummy patterns are provided to suppress the undesired electron beam proximity effect and electrical charging effect. In particular, the dummy patterns are not printable as a photo resist pattern. In some embodiments, a size, a density and/or a dose amount for the dummy patterns are adjusted such that the irradiated portions of the photo resist do not form a distinctive resist pattern. In certain embodiments, size, a density and/or a dose amount for the dummy patterns are adjusted such that a total dose amount per predetermined area for the dummy patterns is substantially equal to a total dose amount per predetermined area for actual patterns. In other embodiments, size, a density and/or a dose amount for the dummy patterns are adjusted such that a total dose amount per predetermined area for the actual patterns and the dummy patterns is within a predetermined range.

Figure 3:
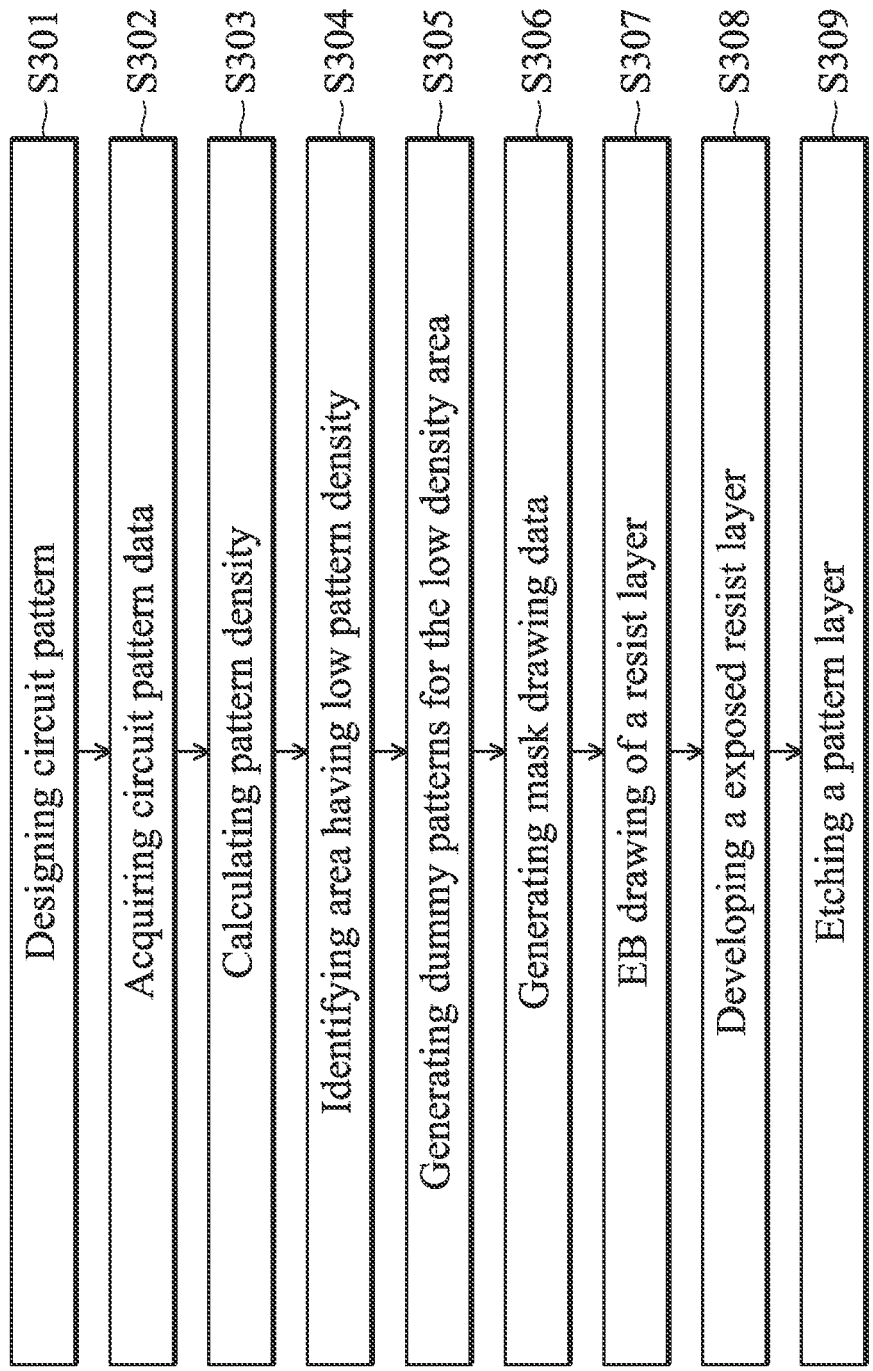
FIG. 3 shows a flowchart illustrating a method of manufacturing photo masks for a semiconductor manufacturing operation according to an embodiment of the present disclosure.

FIG. 3 shows a flowchart illustrating a method of manufacturing photo masks for a semiconductor manufacturing operation according to an embodiment of the present disclosure. It is understood that in the sequential manufacturing process, one or more additional operations can be provided before, during, and after the stages shown in FIG. 3 and some of the operations described below can be replaced or eliminated for additional embodiments of the method. The order of the operations/processes may be interchangeable.

At step S301 of FIG. 3, a circuit pattern layout for one layer in a semiconductor device is designed by using a mask design tool (e.g., an electronic design automation (EDA) tool). The circuit pattern layout for one layer is for one photo mask. In some embodiments, a multiple pattering method is utilized and in such a case, the circuit pattern layout for one layer is divided into multiple photo masks. The circuit pattern layout is generally expressed by polygon data in, for example, GDS-II stream format or in Open Artwork System Interchange Standard format.

At step S302, circuit pattern layout data created by the mask design tool is acquired by a photo mask data generating apparatus. The photo mask data generating apparatus is a separate computer system than the mask design tool in some embodiments, and is a part of the mask design tool in other embodiments.

Then at step S303, a pattern density of the circuit pattern layout data is calculated. The pattern density is defined a ratio per predetermined area (e.g., a unit area) of patterns to be irradiated with an electron beam with respect to the predetermined area. After calculating the pattern density, one or more areas having a pattern density equal to or lower than a threshold pattern density are identified, at step S304. In some embodiments, the threshold density is in a range from about 20% to about 40% (e.g., 30%). For example, a memory cell pattern generally has a higher pattern density, while a peripheral I/O pattern generally has a low pattern density. When the pattern density of a given area is equal to or lower than the threshold pattern density, the given area is identified as a low pattern density area, while an area of which pattern density given area is higher than the threshold pattern density is identified as a high pattern density (dense) area. In other embodiments, when the pattern density of a given area is lower than the threshold pattern density, the given area is identified as a low pattern density area, while an area of which pattern density given area is equal to or higher than the threshold pattern density is identified as a high pattern density area.

At step S305, dummy patterns are generated for the low pattern density areas identified at step S304. In some embodiments, the dummy patterns are fine patterns smaller than the resolution limit of an electron beam lithography tool used to fabricate the photo masks. The pattern size in a pattern layout generally refers to an actual circuit pattern size formed on a semiconductor wafer. Thus, when the photo mask is a 4× mask, the pattern size on a photo mask is four times a pattern size on the semiconductor wafer. In the present disclosure, the pattern size of the dummy patterns and circuit patterns are that on a photo mask, unless otherwise indicated. Thus, for example, the resolution limit of the electron beam lithography tool is 40 nm, i.e., the actual size on the photo mask is 40 nm, the dummy patterns on the pattern layout data have a size less than 160 nm for a 4× mask, or less than 200 nm for a 5× mask. The resolution limit is also affected by a performance of a photo resist and/or a subsequent etching operation. Thus, the size of the dummy patterns is decided considering an overall mask fabricating process capability, and id a practical resolution limit of the mask making process. In some embodiments, after the dummy patterns are generated, the process returns to step S303.

Then, as step S306, the original circuit pattern layout data and the dummy pattern data are combined to generate mask drawing data for the electron beam lithography tool. In some embodiments, the electron beam lithography tool requires its own data format, and in such case, a format conversion operation is performed on the mask drawing data.

At step S307, according to the mask drawing data, a photo resist layer formed on a mask blank is exposed with an electron beam, similar to the operations explained with respect to FIGS. 1A and 1B. Then, the exposed photo resist layer is developed with a developing solution at step S308, similar to the operations explained with respect to FIG. 1C. As step S309, by using the developed photo resist pattern as an etching mask, a pattern layer is etched by dry and/or wet etching and a mask pattern is formed on the mask substrate, similar to the operations explained with respect to FIG. 1D. Then, mask inspection and mask repair operations are performed.

In the foregoing embodiments, the dummy patterns are smaller than the practical resolution limit of the mask making process. Accordingly, after the etching of the pattern layer, there is no pattern corresponding to the dummy pattern. In the case where a positive photo resist is used, an area of the photo resist corresponding to the dummy pattern is irradiated with an electron beam. Although the irradiated area may be partially removed by the developing process, the photo resist remains and thus the underlying pattern layer is not etched.

In other embodiments, the dummy patterns have a size larger than the practical resolution limit of the mask making process using the electron beam lithography tool. In such a case, when the dummy patterns are drawn on the photo resist by an electron beam, a dose amount of the electron beam for the dummy patterns is set smaller than a dose amount for the actual circuit patterns to be printed. In some embodiments, the dose amount of the electron beam for the dummy patterns is set smaller than a threshold dose amount, which is less than a dose amount by which the photo resist layer forms a pattern in the development operation. When the dose amount of the dummy patterns are different (smaller) than the actual circuit patterns, such information is attached to the dummy patterns (e.g., a flag) and send to an electron beam lithography tool.

Figure 4B:
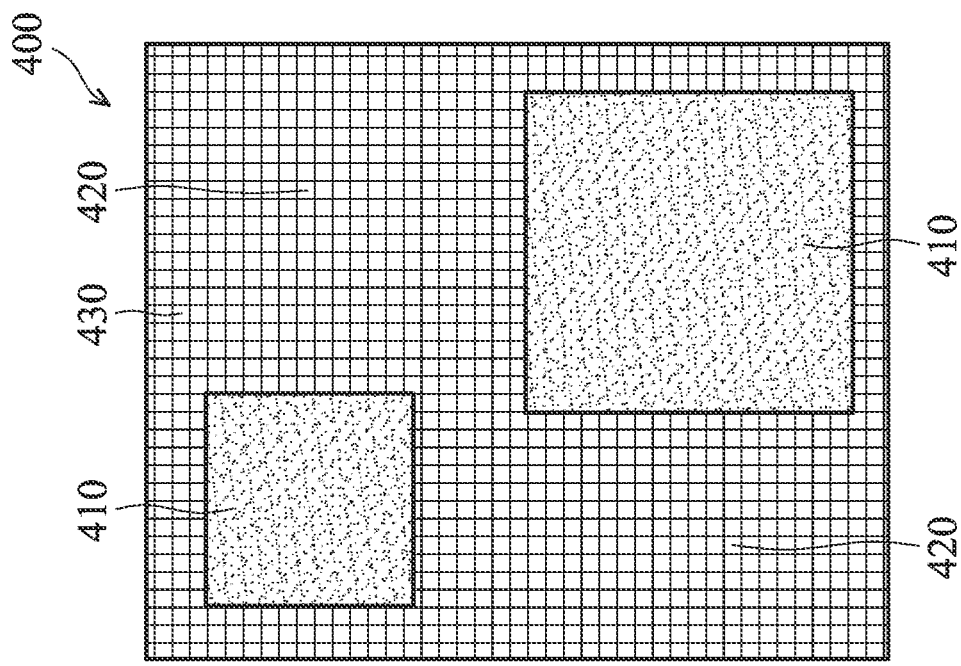
FIG. 4B shows a mask pattern with non-printable dummy patterns according to an embodiment of the present disclosure.
Figure 4A:
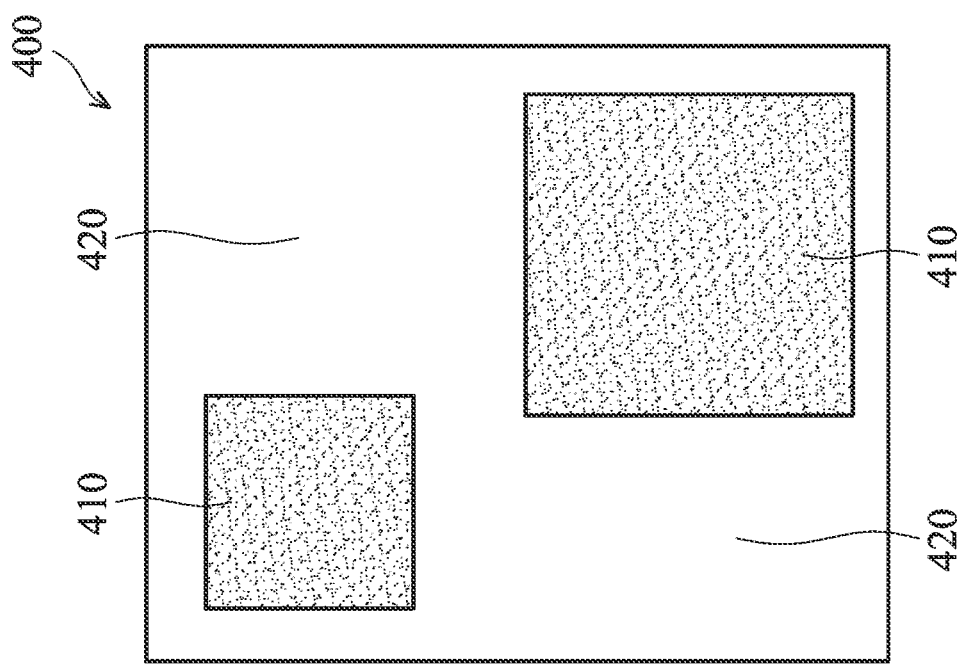
FIG. 4A shows a mask pattern without non-printable dummy patterns.

FIG. 4A shows a mask pattern without non-printable dummy patterns, and FIG. 4B shows a mask pattern with non-printable dummy patterns according to an embodiment of the present disclosure. Methods, materials, configurations, dimensions and/or processes the same as or similar to the foregoing embodiments may be employed in the following embodiments, and detailed explanation thereof may be omitted.

As set forth above, by analyzing the original circuit pattern layout, one or more high pattern density areas 410 are identified within a photo mask layout 400, as shown in FIG. 4A. By identifying the high pattern density areas 410, the remaining areas are identified as low pattern density areas 420.

In some embodiments, the pattern density of the high pattern density areas 201 is, for example, from 30% or more, which means that the threshold pattern density is set 30%. Then, as shown in FIG. 4B, non-printable dummy patterns 430 are generated to fill the low pattern density areas. The non-printable dummy patterns are dummy patterns of which the size is smaller than the resolution limit of the electron beam lithography tool or the practical resolution limit of the mask making process and/or dummy patterns to be exposed at lower exposure dose amounts that do not cause distinctive photo resist patterns.

In some embodiments, the pattern density of the non-printable dummy patterns 430 is set to the same amount as the threshold pattern density. In some embodiments, the non-printable dummy patterns are generated such that a pattern density of the non-printable dummy patterns is in a range from 0.8 times the threshold density to 1.2 times the threshold density of the high pattern density areas.

In other embodiments, the average pattern density of the high density areas are calculated, and the non-printable dummy patterns 430 are generated to have a pattern density the same as the average pattern density. In certain embodiments, the non-printable dummy patterns are generated such that a pattern density of the non-printable dummy patterns is in a range from 0.8 times the threshold density to 1.2 times the average pattern density of the high pattern density areas.

In the embodiment of FIG. 4B, all of the low pattern density areas are filled with non-printable dummy patterns. In other embodiments, only a part of the low pattern density areas are filled with non-printable dummy patterns.

Figure 5B:
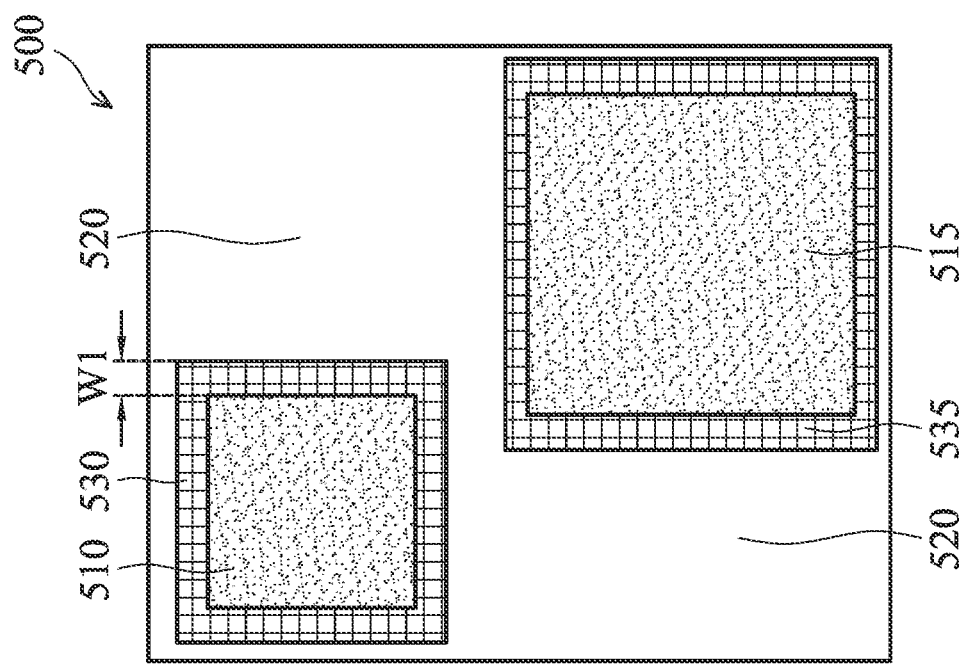
FIG. 5B shows a mask pattern with non-printable dummy patterns according to another embodiment of the present disclosure.
Figure 5A:
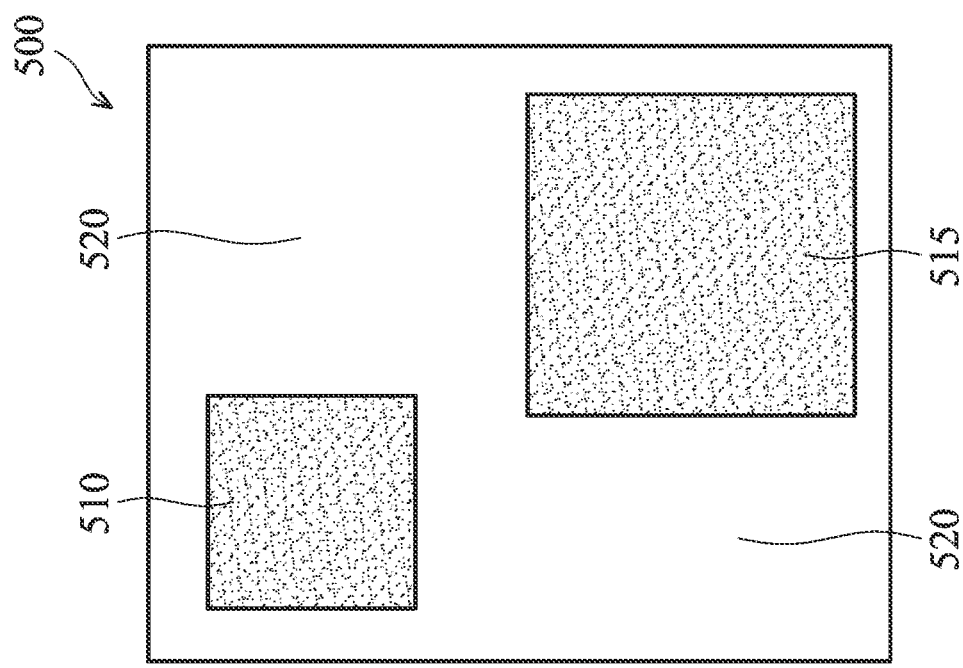
FIG. 5A shows a mask pattern without non-printable dummy patterns.

FIG. 5A shows a mask pattern without non-printable dummy patterns, and FIG. 5B shows a mask pattern with non-printable dummy patterns according to another embodiment of the present disclosure. Methods, materials, configurations, dimensions and/or processes the same as or similar to the foregoing embodiments may be employed in the following embodiments, and detailed explanation thereof may be omitted.

Similar to FIG. 4A, by analyzing the original circuit pattern layout, one or more high pattern density areas 510 and 515 are identified within a photo mask layout 500, as shown in FIG. 5A. By identifying the high pattern density areas 510 and 515, the remaining areas are identified as low pattern density areas 520. Then, as shown in FIG. 5B, non-printable dummy patterns 530 and 535 are generated for the areas surrounding the high pattern density areas 510 and 515.

In this embodiment, as shown in FIG. 5B, the non-printable dummy patterns are generated for the areas within a predetermined distance from the give a high pattern density area. For example, the non-printable dummy pattern area 530 surrounds the high pattern density area 510 within a predetermined distance W1. In some embodiments, the predetermined distance W1 is in a range from 100 µm to 5000 µm on a photo mask, and in other embodiments, the predetermined distance is in a range from 500 µm to 2000 µm on a photo mask.

In some embodiments, the pattern density of the non-printable dummy patterns 530 or 535 is set to the same amount as the threshold pattern density. In some embodiments, the non-printable dummy patterns 530 or 535 are generated such that a pattern density of the non-printable dummy patterns 530 or 535 is in a range from 0.8 times the threshold density to 1.2 times the threshold density of the high pattern density areas 510 or 515.

In other embodiments, the average pattern density of the high density areas 510 or 515 are calculated, and the non-printable dummy patterns 530 or 535 are generated to have a pattern density the same as the average pattern density of the high pattern density areas 510 or 515, respectively. In certain embodiments, the non-printable dummy patterns 530 or 535 are generated such that a pattern density of the non-printable dummy patterns 530 or 535 is in a range from 0.8 times the threshold density to 1.2 times the average pattern density of the high pattern density areas 510 or 515, respectively.

Figure 6A:
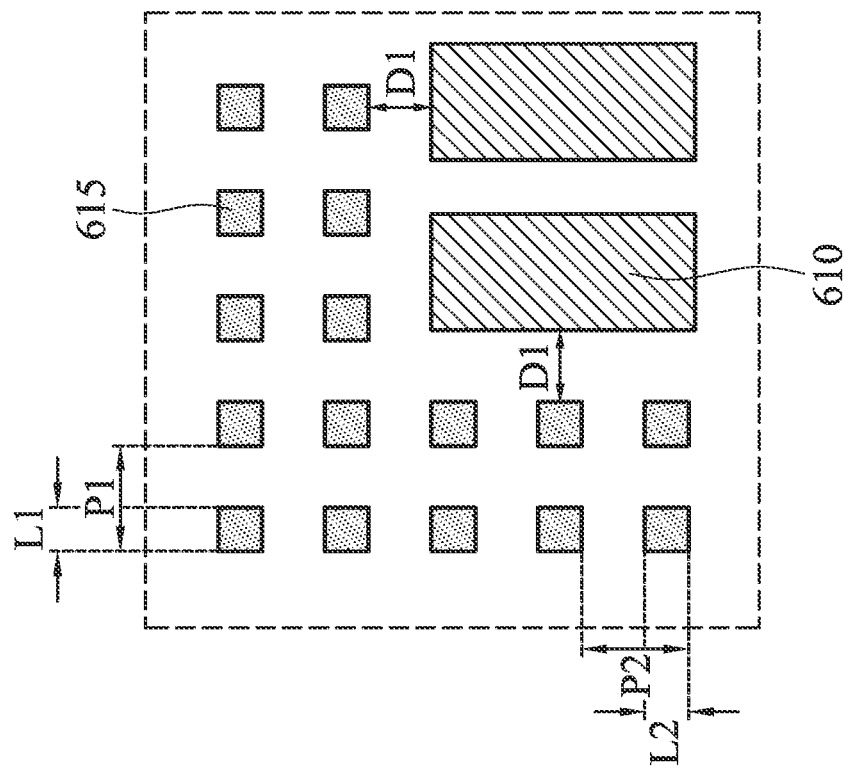
FIG. 6A shows non-printable dummy patterns according to an embodiment of the present disclosure.
Figure 6B:
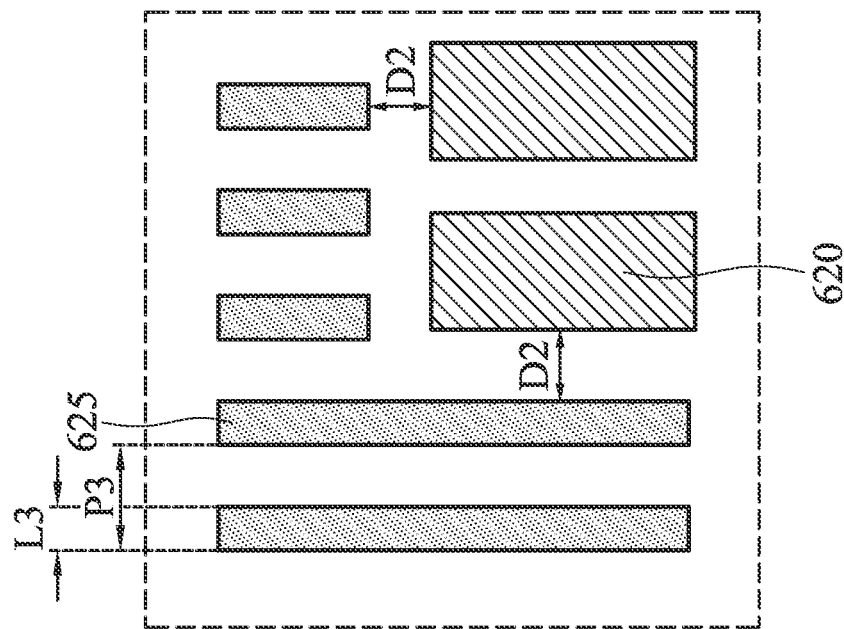
FIG. 6B shows non-printable dummy patterns according to another embodiment of the present disclosure.

FIG. 6A shows non-printable dummy patterns according to an embodiment of the present disclosure, and FIG. 6B shows non-printable dummy patterns according to another embodiment of the present disclosure. Methods, materials, configurations, dimensions and/or processes the same as or similar to the foregoing embodiments may be employed in the following embodiments, and detailed explanation thereof may be omitted.

In some embodiments, the non-printable dummy patterns have a square shape having a size smaller than the resolution limit and are periodically arranged in a matrix, as shown in FIG. 6A. In some embodiments, the non-printable dummy patterns 615 have a length L1 and L2 and are arranged with a pitch P1 and P2, respectively. In certain embodiments, L1=L2 and P1=P2, and in such a case, the pattern density of the non-printable dummy patterns 615 can be defined as $(L1/P1)^2$. By adjusting the pitch P1 or P2, the pattern density of the non-printable dummy patterns 615 can be adjusted. As shown in FIG. 6A, the non-printable dummy patterns 615 are generated to have a distance D1 from the actual circuit patterns 610. The distance D1 is in a range from about 500 nm to 5000 nm on a photo mask.

In FIG. 6B, line-and-space patterns periodically arranged in one direction are used as non-printable dummy patterns 625. The line-and-space patterns have a width (length) L3 and a pitch P3, which is smaller than the resolution limit as shown in FIG. 6B. The pattern density of the non-printable dummy patterns 625 can be defined as (L3/P3). By adjusting the pitch P3, the pattern density of the non-printable dummy patterns 615 can be adjusted. As shown in FIG. 6B, the non-printable dummy patterns 625 are generated to have a distance D2 from the actual circuit patterns 620. The distance D2 is in a range from about 500 nm to 5000 nm on a photo mask.

Figures 7A, 7B:
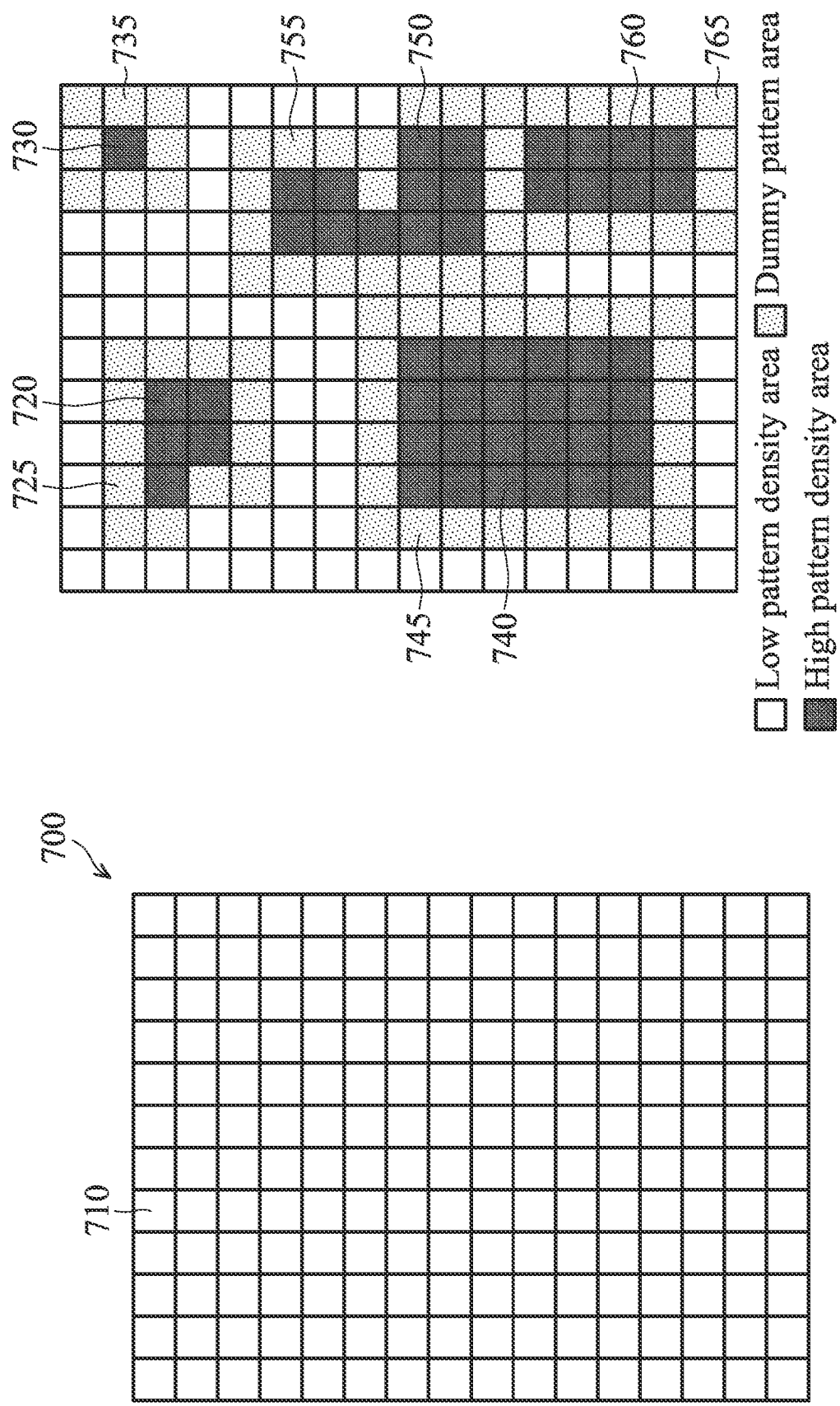
FIG. 7A shows a process for determining areas for non-printable dummy patterns according to an embodiment of the present disclosure.
FIG. 7B shows a process for determining areas for non-printable dummy patterns according to an embodiment of the present disclosure.

FIGS. 7A and 7B show a process for determining areas for non-printable dummy patterns according to an embodiment of the present disclosure. Methods, materials, configurations, dimensions and/or processes the same as or similar to the foregoing embodiments may be employed in the following embodiments, and detailed explanation thereof may be omitted.

As shown in FIG. 7A, the photo mask area 700 is divided into a plurality of sub areas 710 arranged in a matrix. The size of each of the plurality of sub areas 710 is in a range from 50 µm to 2500 µm on a photo mask, and in other embodiments, the size is in a range from 100 µm to 1000 µm on a photo mask. In some embodiments, each of the plurality of sub areas 710 has a square shape.

Within each of the plurality of sub areas 710, a pattern density is calculated, and then sub areas having a pattern density higher than a threshold pattern density are identified as a high pattern density area (or sub areas having a pattern density lower than a threshold pattern density are identified as a low pattern density area). In an embodiment, as shown in FIG. 7B, high pattern density areas 720, 730, 740, 750 and 760 are identified.

Then, as shown in FIG. 7B, dummy pattern areas 725, 735, 745, 755 and 765, in which non-printable dummy patterns generated to adjust the pattern density of the dummy pattern areas, are provided to surround the high pattern density areas 720, 730, 740, 750 and 760, respectively. In some embodiments, the pattern density of each dummy pattern area after the non-printable dummy patterns are generated in the dummy pattern area is equal to a predetermined pattern density. In certain embodiments, the predetermined pattern density is the same as the threshold pattern density that is used to define the high pattern density areas and the low pattern density areas. In other embodiments, the pattern density of each dummy pattern area after the non-printable dummy patterns are generated in the dummy pattern area is about 0.8 times to about 1.2 times the average pattern density of the corresponding high pattern density area. For example, the pattern density of dummy pattern area 725 after the non-printable dummy patterns are generated is about 0.8 times to about 1.2 times the average pattern density of the high pattern density area 720. In certain embodiments, the pattern density of each dummy pattern area after the non-printable dummy patterns are generated in the dummy pattern area is equal to the average pattern density of the corresponding high pattern density area.

Figure 8A:
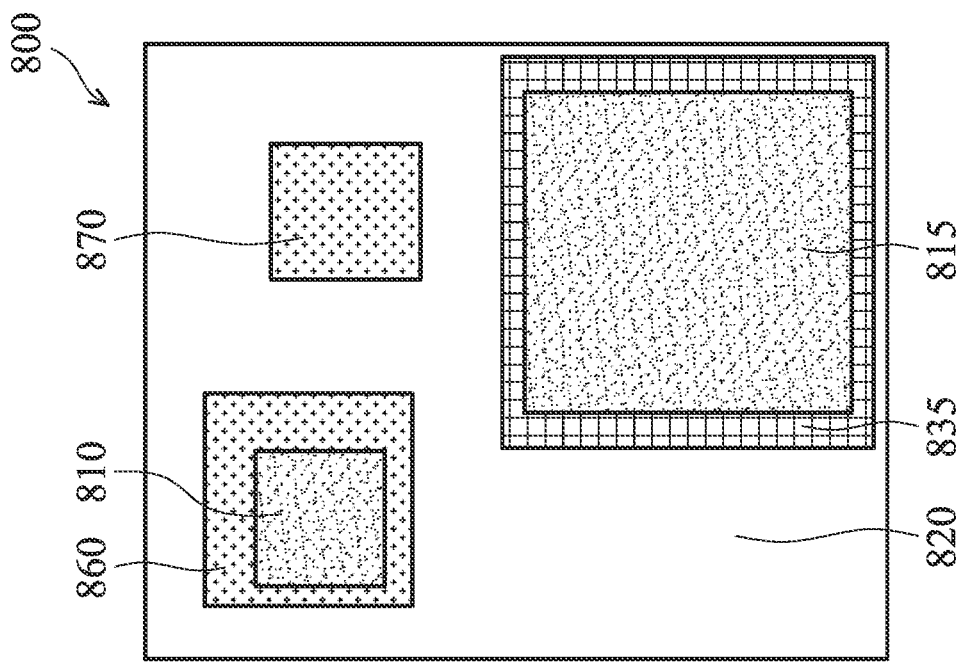
FIG. 8A shows non-printable dummy patterns according to an embodiment of the present disclosure.
Figure 8B:
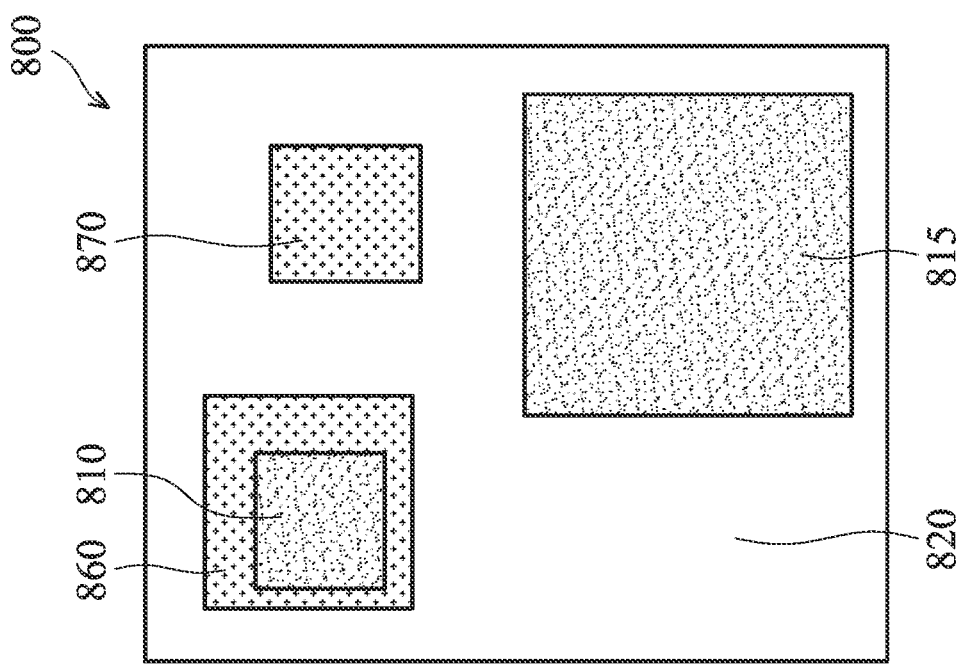
FIG. 8B shows non-printable dummy patterns according to another embodiment of the present disclosure.

FIG. 8A shows non-printable dummy patterns according to an embodiment of the present disclosure, and FIG. 8B shows non-printable dummy patterns according to another embodiment of the present disclosure. Methods, materials, configurations, dimensions and/or processes the same as or similar to the foregoing embodiments may be employed in the following embodiments, and detailed explanation thereof may be omitted.

In the following embodiments, two or more threshold pattern densities are sets. For example, low pattern density areas 820 having a lower pattern density than a first threshold pattern density, middle pattern density areas 860 and 870 having a pattern density higher than the first threshold pattern density and lower than a second threshold pattern density (higher than the first threshold pattern density), and high pattern density areas 810 and 815 having a pattern density higher than the second threshold pattern density are identified within a photo mask 800, as shown in FIG. 8A.

In the embodiments of FIGS. 5A and 5B or 7A and 7B above, when the pattern density of a given area is more than (or, equal to or more than) the threshold pattern density, the area is identified as a high pattern density area and an adjacent area having a smaller pattern density than the threshold is identified as a low pattern density area. However, in some cases, the pattern density of the low pattern density area adjacent to the high pattern density area is close to the threshold. For example, the threshold pattern density is 30% and the pattern density of the low pattern density area adjacent to the high pattern density area is 29%. In such a case, it may not be necessary to provide non-printable dummy patterns to adjust the pattern density because adding non-printable dummy patterns increases mask data processing time and the amount of the mask data.

In the embodiments of FIGS. 8A and 8B, the non-printable dummy patterns are provided when the high pattern density area is adjacent to the low pattern density area and no non-printable dummy pattern is provided around the middle pattern density areas and high pattern density area adjacent to the middle pattern density area. In FIG. 8B, dummy pattern area 835 is provided only around the high pattern density area 815 and no non-printable dummy pattern area is provided around high pattern density area 810 and the middle pattern density area 860 and 870. In some embodiments, a different in percent points between the first threshold and the second threshold is in a range from about 5 to 20 (e.g., 30% vs 25-10%). In other embodiments, two or more middle pattern density areas are identified. In the embodiments of FIGS. 8A and 8B, when the pattern density drastically changes (high pattern density area to low pattern density area) in adjacent sub areas, non-printable dummy patterns are provided to surround the higher pattern density sub area. In certain embodiments, when the pattern density of sub areas changes 5-20 percentage points (e.g., 30% vs 25-10%), non-printable dummy patterns are provided. In some embodiments, the pattern density after the non-printable dummy patterns are provided is the same as the pattern density of the average of the middle pattern density areas.

Further, after the non-printable dummy patterns are provided, the pattern density of the entire photo mask is re-calculated. Then, it is determined whether there are adjacent sub areas having abrupt density change (e.g., 5-20 percentage points). When the adjacent sub areas having abrupt density change are found, additional non-printable dummy patterns are provided.

FIGS. 8C-8G show another embodiment of generating photo mask data with non-printable dummy patterns. Methods, materials, configurations, dimensions and/or processes the same as or similar to the foregoing embodiments may be employed in the following embodiments, and detailed explanation thereof may be omitted.

Figure 8C:
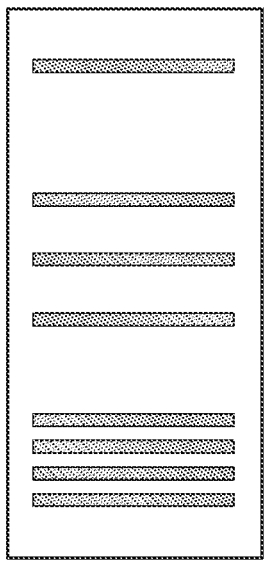
FIG. 8C shows another embodiment of generating photo mask data with non-printable dummy patterns.
Figure 8D:
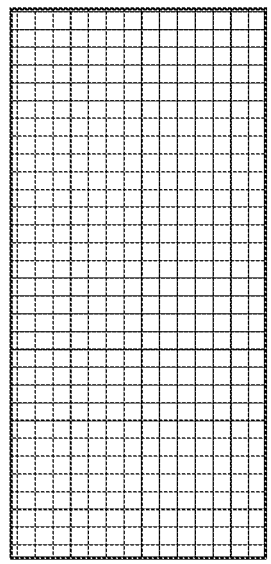
FIG. 8D shows another embodiment of generating photo mask data with non-printable dummy patterns.
Figure 8E:
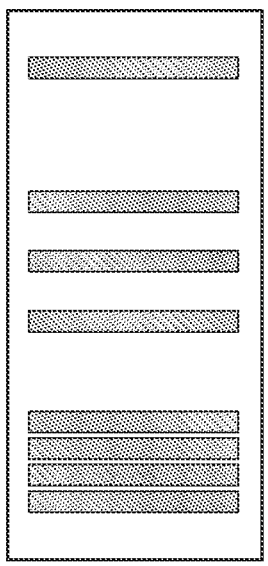
FIG. 8E shows another embodiment of generating photo mask data with non-printable dummy patterns.
Figure 8F:
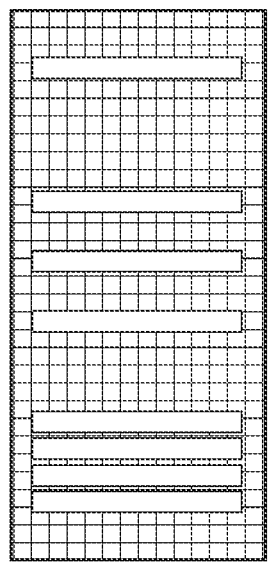
FIG. 8F shows another embodiment of generating photo mask data with non-printable dummy patterns.
Figure 8G:
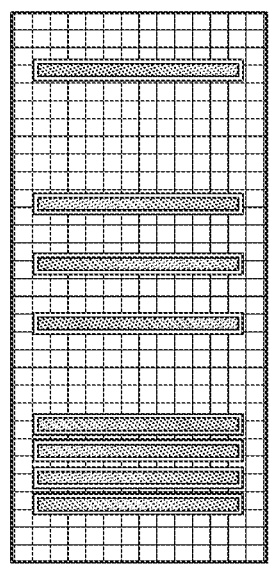
FIG. 8G shows another embodiment of generating photo mask data with non-printable dummy patterns.

FIG. 8C shows actual circuit patterns with a high density area (left) and a low density area (right). FIG. 8D shows non-printable dummy patterns provided in the entire area of the circuit patterns of FIG. 8C. Then, the actual circuit patterns of FIG. 8C are enlarged (biased) by, for example, about 500 nm to 5000 nm on a photo mask (same as D1 or D2 of FIGS. 6A and 6B). The biased amount (D1, D2) may be adjusted depending on the pattern density and/or mask fabrication process. Next, a logical operation is performed between the mask data of FIG. 8D and FIG. 8E by subtracting the data of FIG. 8E from the data of FIG. 8D. FIG. 8F is the result of the subtraction. Then, a logical operation is performed between the mask data of FIG. 8F and FIG. 8C by adding the data of FIG. 8C and the data of FIG. 8F. FIG. 8G is the result of the addition, which shows photo mask data with actual circuit patterns and non-printable dummy patterns.

Figure 8H:
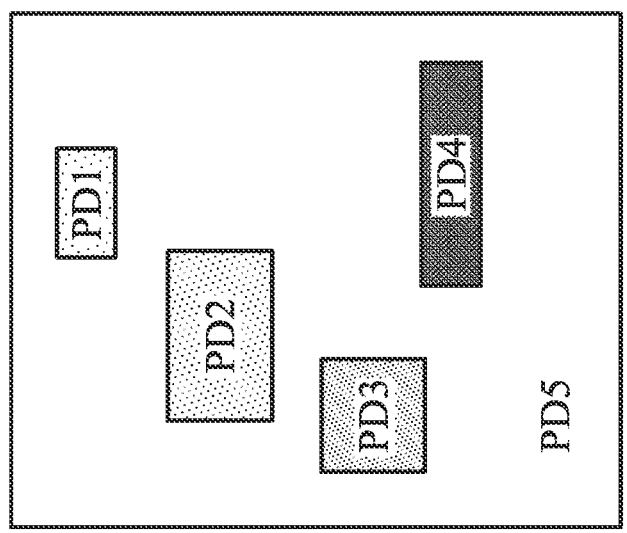
FIG. 8H shows another embodiment of generating photo mask data with non-printable dummy patterns.

FIG. 8H shows another embodiment of generating photo mask data with non-printable dummy patterns. Methods, materials, configurations, dimensions and/or processes the same as or similar to the foregoing embodiments may be employed in the following embodiments, and detailed explanation thereof may be omitted.

In this embodiments, the mask area is divided into small areas (grids), for example, about 100 μm×100 μm to about 1000 μm×1000 μm (e.g., 256 μm×256 μm), and the pattern density of the layout patterns are calculated for each small area. The small areas are not necessarily a square. In FIG. 8H, the patterns are divided into five pattern density areas, each of which has patterns within a predetermined pattern density range. For example, PD1 is for areas having a pattern density of 10%-20%, PD2 is areas having a pattern density of 20%-30%, PD3 is for areas having a pattern density of 30%-40%, PD4 is for areas having a pattern density of more than 40%, and PD5 is for areas having a pattern density of less than 10%. The ranges of the pattern density are merely an example and other ranges can be utilized. Then, non-printable dummy patterns are provided around each area to make the pattern density of the entire mask uniform (e.g., a variation (max-min) of pattern densities is less than 10%). In some embodiments, the operations explained with respect to the foregoing embodiments (e.g., FIGS. 8C-8G or others) are performed on each area.

Figure 9A:
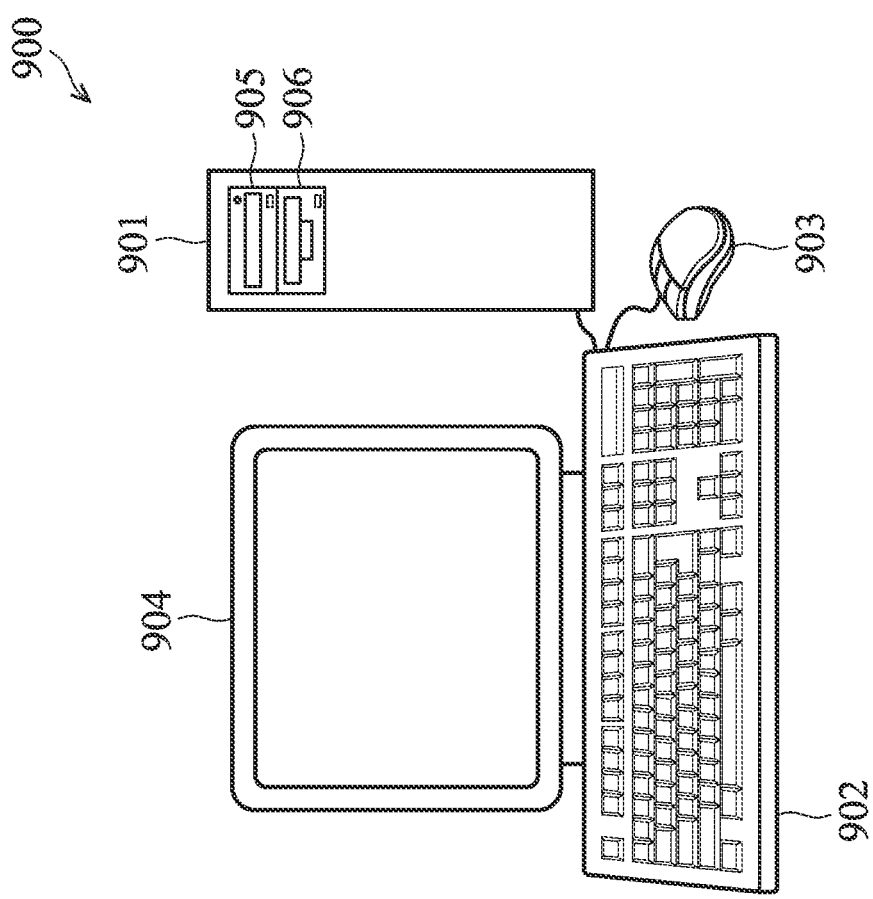
FIG. 9A shows a photo mask data generating apparatus according to an embodiment of the present disclosure.
Figure 9B:
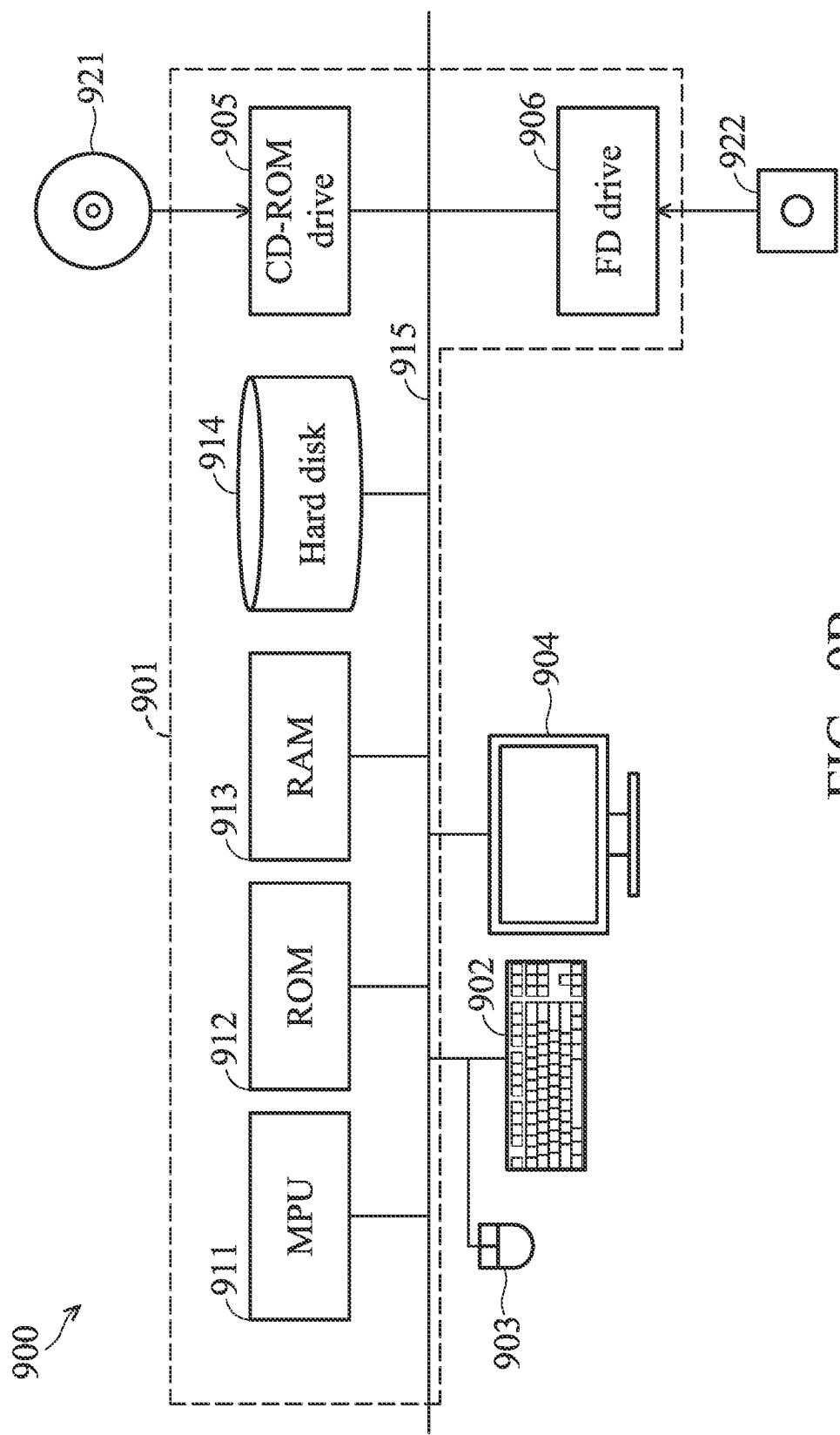
FIG. 9B shows a photo mask data generating apparatus according to an embodiment of the present disclosure.

FIGS. 9A and 9B show a photo mask data generating apparatus according to an embodiment of the present disclosure. FIG. 9A is a schematic view of a computer system that executes the photo mask data generating process according to one or more embodiments as described above. All of or a part of the process, method and/or operations of the foregoing embodiments can be realized using computer hardware and computer programs executed thereon. In FIG. 9A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 9B is a diagram showing an internal configuration of the computer system 900. In FIG. 9B, the computer 901 is provided with, in addition to the optical disk drive 905 and the magnetic disk drive 906, one or more processors 911, such as a micro processing unit (MPU), a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the computer system 900 to execute the functions of the photo mask data generating apparatus in the foregoing embodiments may be stored in an optical disk 921 or a magnetic disk 922, which are inserted into the optical disk drive 905 or the magnetic disk drive 906, and transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network.

The program does not necessarily have to include, for example, an operating system (OS) or a third party program to cause the computer 901 to execute the functions of the photo mask data generating apparatus in the foregoing embodiments. The program may only include a command portion to call an appropriate function (module) in a controlled mode and obtain desired results.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs in some embodiments. Furthermore, a computer that executes the programs may be a single computer or may be multiple computers.

Further, the entirety of or a part of the programs to realize the functions of the photo mask data generating apparatus is a part of another program used for photo mask fabrication processes in some embodiments. In addition, the entirety of or a part of the programs to realize the functions of the photo mask data generating apparatus is realized by a ROM made of, for example, a semiconductor device in some embodiments.

As set forth above, by identifying high pattern density areas in photo mask data and adding non-printable dummy patterns, it is possible to reduce the electron beam proximity effect and/or the electrical charging effect in electron beam lithography for fabricating a photo mask. In some embodiments, by limiting areas for the non-printable dummy patterns, it is possible to suppress an increase in data volume of the photo mask data. Further, by using regularly arranged dummy patterns, it is possible to suppress an increase in data volume of the photo mask data.

It will be understood that not all advantages have been necessarily discussed herein, no particular advantage is required for all embodiments or examples, and other embodiments or examples may offer different advantages.

In accordance with an aspect of the present disclosure, in a method of manufacturing a photo mask for lithography, circuit pattern data are acquired. A pattern density, which is a total pattern area per predetermined area, is calculated from the circuit pattern data. Dummy pattern data for areas having pattern density less than a threshold density are generated. Mask drawing data is generated from the circuit pattern data and the dummy pattern data. By using an electron beam from an electron beam lithography apparatus, patterns are drawn according to the mask drawing data on a resist layer formed on a mask blank substrate. The drawn resist layer is developed using a developing solution. Dummy patterns included in the dummy pattern data are not printed as a photo mask pattern when the resist layer is exposed with the electron beam and is developed. In one or more of the foregoing or following embodiments, a dose amount of the electron beam for the dummy patterns included in the dummy patterns data is smaller than a dose amount of the electron beam for circuit patterns included in the circuit patterns data. In one or more of the foregoing or following embodiments, the dose amount of the electron beam for patterns corresponding to the dummy patterns data is set smaller than a threshold dose amount, and the threshold dose amount is less than a dose amount by which the resist layer forms a pattern by the developing using the developing solution. In one or more of the foregoing or following embodiments, a size of the dummy patterns is less than a resolution limit of a patterning operation using the electron beam lithography apparatus. In one or more of the foregoing or following embodiments, the dummy pattern data includes periodically arranged dummy patterns. In one or more of the foregoing or following embodiments, the dummy pattern data is generated such that a pattern density of the areas after the dummy patterns are provided is in a range from 0.8 times the threshold density to 1.2 times the threshold density. In one or more of the foregoing or following embodiments, the dummy pattern data is generated such that a pattern density of the areas after the dummy patterns are provided is equal to the threshold density. In one or more of the foregoing or following embodiments, the threshold density is in a range from 20% to 40%. In one or more of the foregoing or following embodiments, the dummy pattern data is generated such that the dummy patterns are arranged to surround a dense area having a pattern density equal to or greater than the threshold density, within a predetermined distance from the dense area. In one or more of the foregoing or following embodiments, the predetermined distance is in a range from 100 μm to 5000 μm. In one or more of the foregoing or following embodiments, the dummy pattern data is generated such that a pattern density of an entirety photo mask after the dummy patterns are provided is within a predetermined range. In one or more of the foregoing or following embodiments, the predetermined range is a range from 0.8 times the threshold density to 1.2 times the threshold density. In one or more of the foregoing or following embodiments, the predetermined range is more than 0.5 times the threshold density and less than the threshold density. In one or more of the foregoing or following embodiments, a first threshold density and a second threshold density different from the first threshold density are set as the threshold density. The dummy pattern data is generated such that first dummy patterns are arranged to surround a first area having a pattern density equal to or greater than the first threshold density, and second dummy patterns are arranged to surround a second area having a pattern density equal to or greater than the second threshold density. A pattern density of first dummy patterns is different from a pattern density of second dummy patterns.

In accordance with another aspect of the present disclosure, a photo mask data generating apparatus includes a processor and a non-transitory computer readable medium storing a program. The program, when executed by the processor, causes the mask data generating apparatus to perform: acquiring circuit pattern data, calculating pattern density from the circuit pattern data, generating dummy pattern data for areas having pattern density less than a threshold density, generating mask drawing data by combining the circuit pattern data and the dummy pattern data, and outputting the generated mask drawing data to an electron beam lithography apparatus. Dummy pattern data includes dummy patterns not printable as a photo mask pattern when a resist layer formed on a mask blank substrate is exposed with an electron beam by an electron beam lithography apparatus and is developed. In one or more of the foregoing or following embodiments, the dummy pattern data is generated such that a pattern density of the areas is in a range from 0.8 times the threshold density to 1.2 times the threshold density. In one or more of the foregoing or following embodiments, the dummy pattern data includes periodically arranged dummy patterns. In one or more of the foregoing or following embodiments, the threshold density is in a range from 20% to 40%. In one or more of the foregoing or following embodiments, the dummy pattern data is generated such that the dummy patterns are arranged to surround a dense area having a pattern density equal to or greater than the threshold density, within a predetermined distance from the dense area. In one or more of the foregoing or following embodiments, the predetermined distance is in a range from 100 μm to 5000 μm on a photo mask.

In accordance with another aspect of the present disclosure, a non-transitory computer readable medium stores a program. The program, when executed by a processor in a mask data generating apparatus, causes the mask data generating apparatus to perform: acquiring circuit pattern data, calculating pattern density from the circuit pattern data, generating dummy pattern data for areas having pattern density less than a threshold density, generating mask drawing data by combining the circuit pattern data and the dummy pattern data, and outputting the generated mask drawing data to an electron beam lithography apparatus. The size of dummy patterns included in the dummy pattern data is smaller than a resolution limit of a patterning operation using the electron beam lithography apparatus.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pattern formation method, comprising:
acquiring circuit pattern data;
generating base dummy pattern data for an entire circuit area;
enlarging each pattern of the circuit pattern data to generate enlarged circuit pattern data;
logically combining the enlarged circuit data pattern and the base dummy pattern data to generate dummy pattern data; and
generating drawing data by combining the dummy pattern data and the circuit pattern data;
wherein dummy patterns included in the dummy pattern data are not printable as a resist pattern over a substrate.

2. The pattern formation method of claim 1, wherein a logical operation of the logically combining the enlarged circuit data pattern and the base dummy pattern data comprises logical subtraction.

3. The pattern formation method of claim 1, wherein a size of the dummy patterns is less than a resolution limit of a patterning operation using a lithography apparatus.

4. The pattern formation method of claim 1, wherein the dummy pattern data includes periodically arranged dummy patterns.

5. The pattern formation method of claim 1, wherein each pattern of the circuit pattern data is enlarged by 500 nm to 5000 nm.

6. The pattern formation method of claim 1, further comprising:
drawing, by using a lithography apparatus, patterns according to the drawing data on a resist layer formed on the substrate; and
developing the drawn resist layer using a developing solution.

7. A pattern formation method, comprising:
acquiring circuit pattern data;
dividing patterns in the circuit pattern data into multiple areas having different pattern density ranges; and
generating dummy pattern data such that dummy patterns surround each of the multiple areas to generate drawing data;
wherein the dummy patterns included in the dummy pattern data are not printable as a resist pattern on a substrate, and
the dummy pattern data are generated such that a variation of pattern density of an entire area is smaller than 10%.

8. The pattern formation method of claim 7, further comprising:
dividing the entire area into areas;
calculating a pattern density for each of the areas,
wherein the dividing patterns is performed based on the pattern density of each of the areas.

9. The pattern formation method of claim 8, wherein a size of the dummy patterns is less than a resolution limit of a patterning operation using an electron beam lithography apparatus.

10. The pattern formation method of claim 8, wherein the dummy pattern data includes periodically arranged dummy patterns.

11. A pattern formation method comprising:
receiving a design circuit layout with a first pattern density variation;
modulating the design circuit layout according to the first pattern density variation;
adding dummy features to the design circuit layout to form a modified layout with a second pattern density variation; and
outputting the modified layout.

12. The pattern formation method of claim 11, wherein the first pattern density variation is different from the second pattern density variation.

13. The pattern formation method of claim 12, further comprising:
forming a photomask having a mask circuit layout with a third pattern density variation, based on the modified layout; and
forming a circuit layer on a substrate with a fourth pattern density variation by a lithographic and an etching process using the photomask.

14. The pattern formation method of claim 13, wherein the first pattern density variation is substantially equal to the third and the fourth pattern density variations.

15. The pattern formation method of claim 12, wherein the first pattern density variation is greater than the second pattern density variation.

16. The pattern formation method of claim 11, wherein the adding dummy features to the design circuit layout comprises generating dummy pattern data for areas having a pattern density less than a threshold density.

17. The pattern formation method of claim 13, wherein the dummy features are not present in the circuit layer.

18. The pattern formation method of claim 16, wherein the dummy features include periodically arranged dummy patterns.

19. The pattern formation method of claim 16, wherein the dummy pattern data is generated such that a pattern density of the areas after the dummy features are provided is in a range from 0.8 times the threshold density to 1.2 times the threshold density.

20. The pattern formation method of claim 16, wherein the threshold density is in a range from 20% to 40%.

* * * * *